United States Patent
Katsunaga et al.

(10) Patent No.: US 7,443,240 B2
(45) Date of Patent: Oct. 28, 2008

(54) AM INTERMEDIATE FREQUENCY VARIABLE GAIN AMPLIFIER CIRCUIT, VARIABLE GAIN AMPLIFIER CIRCUIT AND ITS SEMICONDUCTOR INTEGRATED CIRCUIT

(75) Inventors: Hiroshi Katsunaga, Kariya (JP); Hiroshi Miyagi, Joetsu (JP)

(73) Assignees: Kabushiki Kaisha Toyota Jidoshokki, Kariya-Shi (JP); Niigata Seimitsu Co., Ltd., Joetsu-Shi (JP)

( * ) Notice: Subject to any disclaimer, the term of this patent is extended or adjusted under 35 U.S.C. 154(b) by 0 days.

(21) Appl. No.: 10/580,167

(22) PCT Filed: Nov. 11, 2004

(86) PCT No.: PCT/JP2004/016774

§ 371 (c)(1),
(2), (4) Date: Apr. 13, 2007

(87) PCT Pub. No.: WO2005/050834

PCT Pub. Date: Jun. 2, 2005

(65) Prior Publication Data

US 2007/0273435 A1   Nov. 29, 2007

(30) Foreign Application Priority Data

Nov. 19, 2003   (JP) .............................. 2003-389693

(51) Int. Cl.
   *H03F 3/45* (2006.01)
(52) U.S. Cl. .................... 330/254; 330/261; 330/253
(58) Field of Classification Search .............. 330/254, 330/261, 253
   See application file for complete search history.

(56) References Cited

U.S. PATENT DOCUMENTS

| | | | | |
|---|---|---|---|---|
| 3,641,450 A | * | 2/1972 | Lunn | ......................... 330/254 |
| 5,642,077 A | * | 6/1997 | Nagaraj | ...................... 330/253 |
| 6,744,320 B2 | * | 6/2004 | Nguyen et al. | .............. 330/254 |
| 7,215,196 B2 | * | 5/2007 | Banba et al. | ................. 330/254 |
| 2006/0044064 A1 | * | 3/2006 | Pelleriti | ...................... 330/254 |
| 2007/0236289 A1 | * | 10/2007 | Iriguchi | ..................... 330/253 |

FOREIGN PATENT DOCUMENTS

JP   A-01-212009   8/1989

(Continued)

OTHER PUBLICATIONS

Korean Office Action dated Jan. 30, 2007 for application No. 2006-7008428 with English translation.

*Primary Examiner*—Patricia Nguyen
(74) *Attorney, Agent, or Firm*—Morgan & Finnegan, LLP

(57) ABSTRACT

It is an object of the present invention to provide a variable gain amplifier circuit operable with a low power supply voltage and with less noise generated inside the circuit. In the variable gain amplifier circuit, a third MOS transistor is connected between the respective sources of two MOS transistors constituting a differential amplifier circuit and to the gate of the third MOS transistor, and a DC bias voltage for operating the third MOS transistor in a non-saturated region is supplied. If the output voltage of an AM intermediate frequency variable gain amplifier circuit increases, a control voltage for reducing the resistance between the source and drain of the third MOS transistor is applied to reduce the gain of the AM intermediate frequency variable gain amplifier circuit.

8 Claims, 6 Drawing Sheets

FOREIGN PATENT DOCUMENTS

| | | |
|---|---|---|
| JP | A-02-081505 | 3/1990 |
| JP | A-05-029856 | 2/1993 |
| JP | A-05-335848 | 12/1993 |
| JP | A-07-122950 | 5/1995 |
| WO | WO 01/63754 A1 | 8/2001 |

* cited by examiner

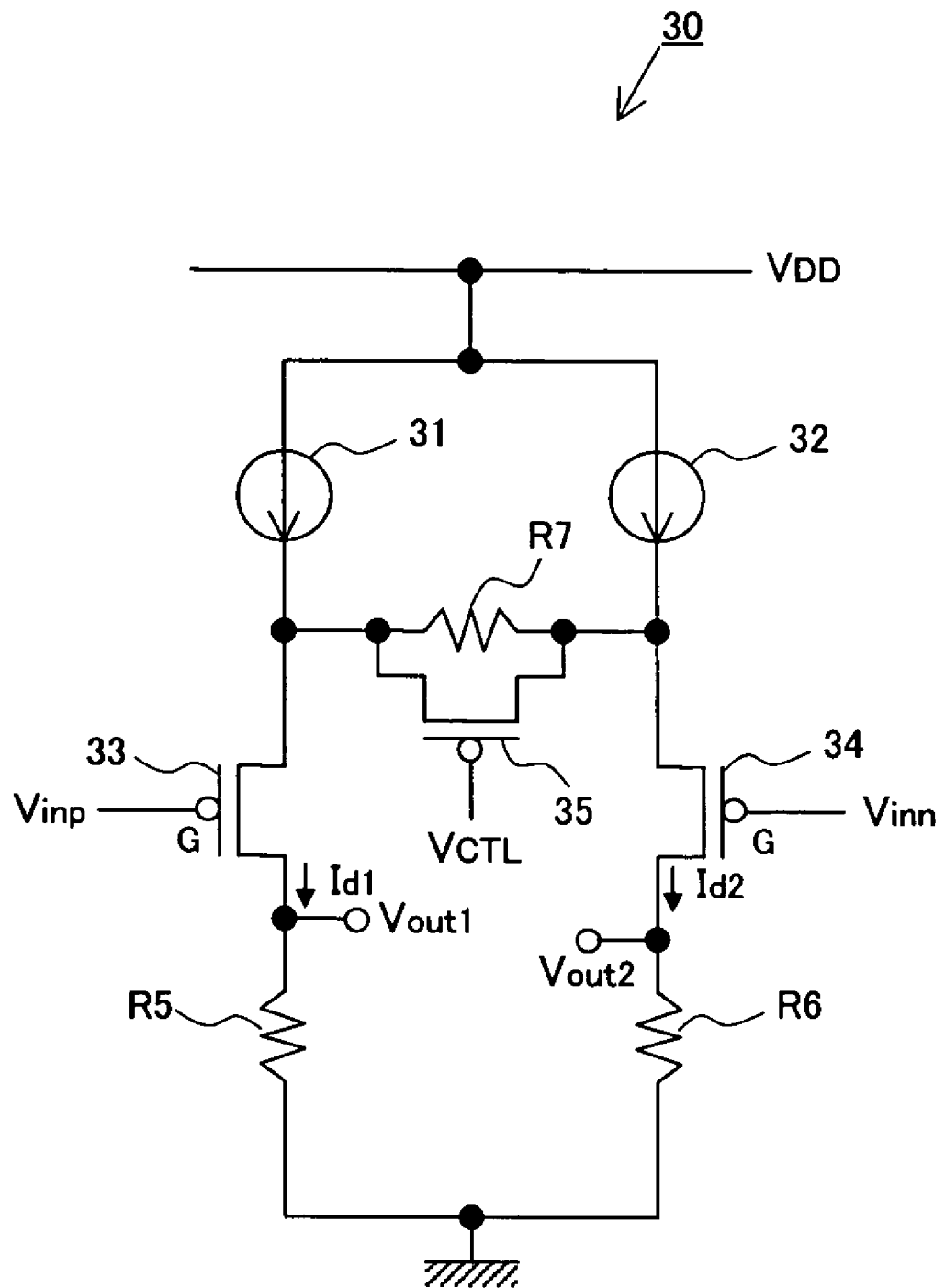
F I G. 1

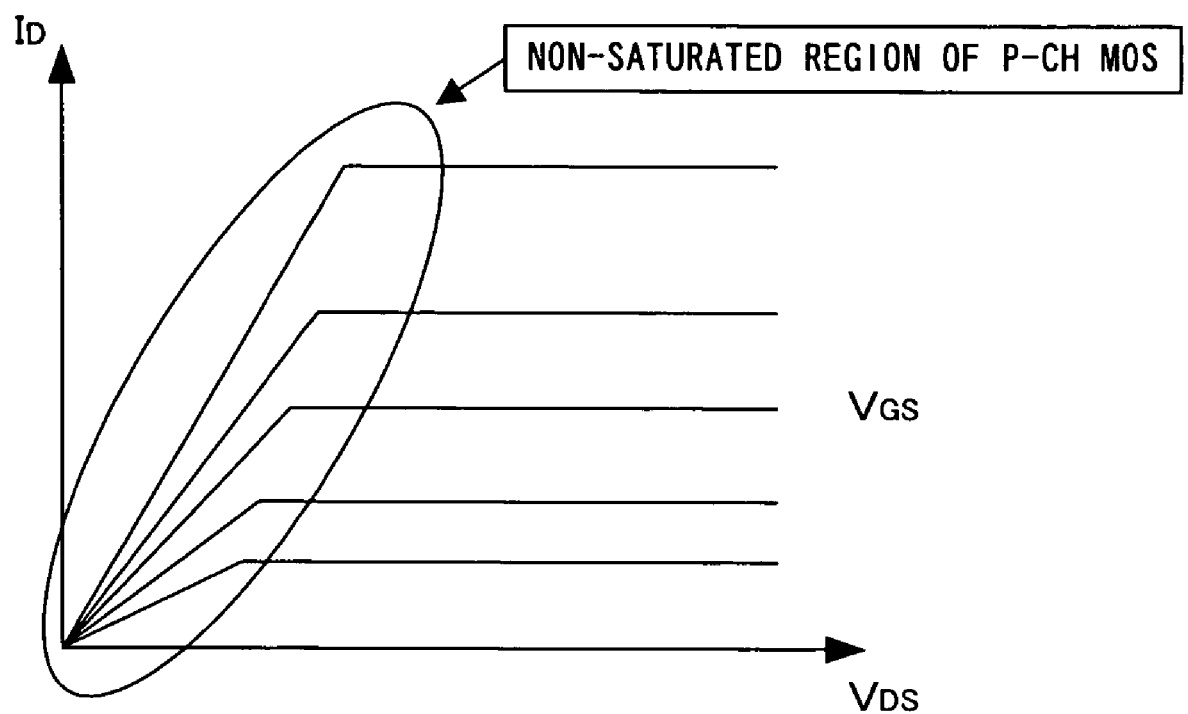
F I G. 2

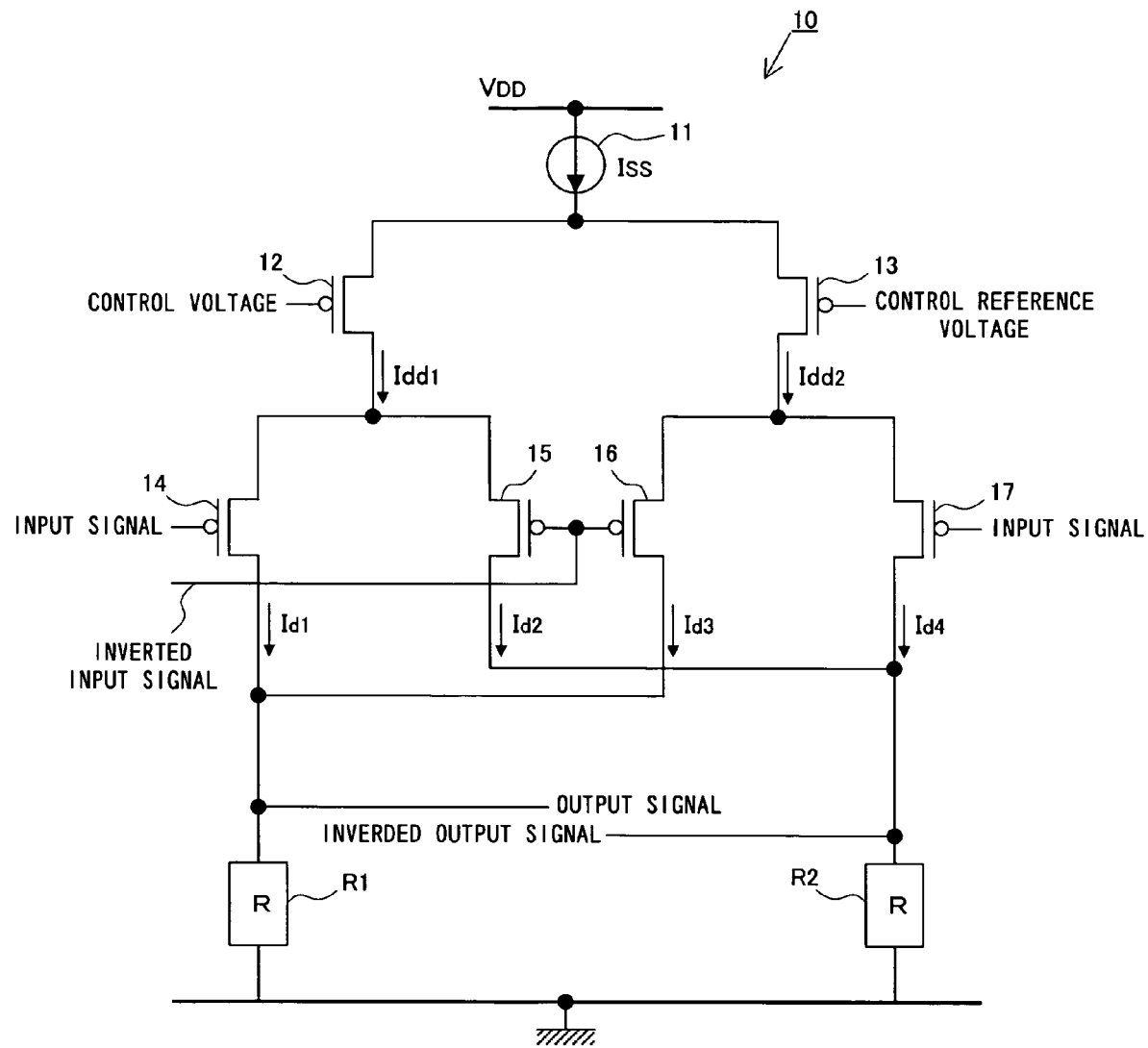
F I G. 4

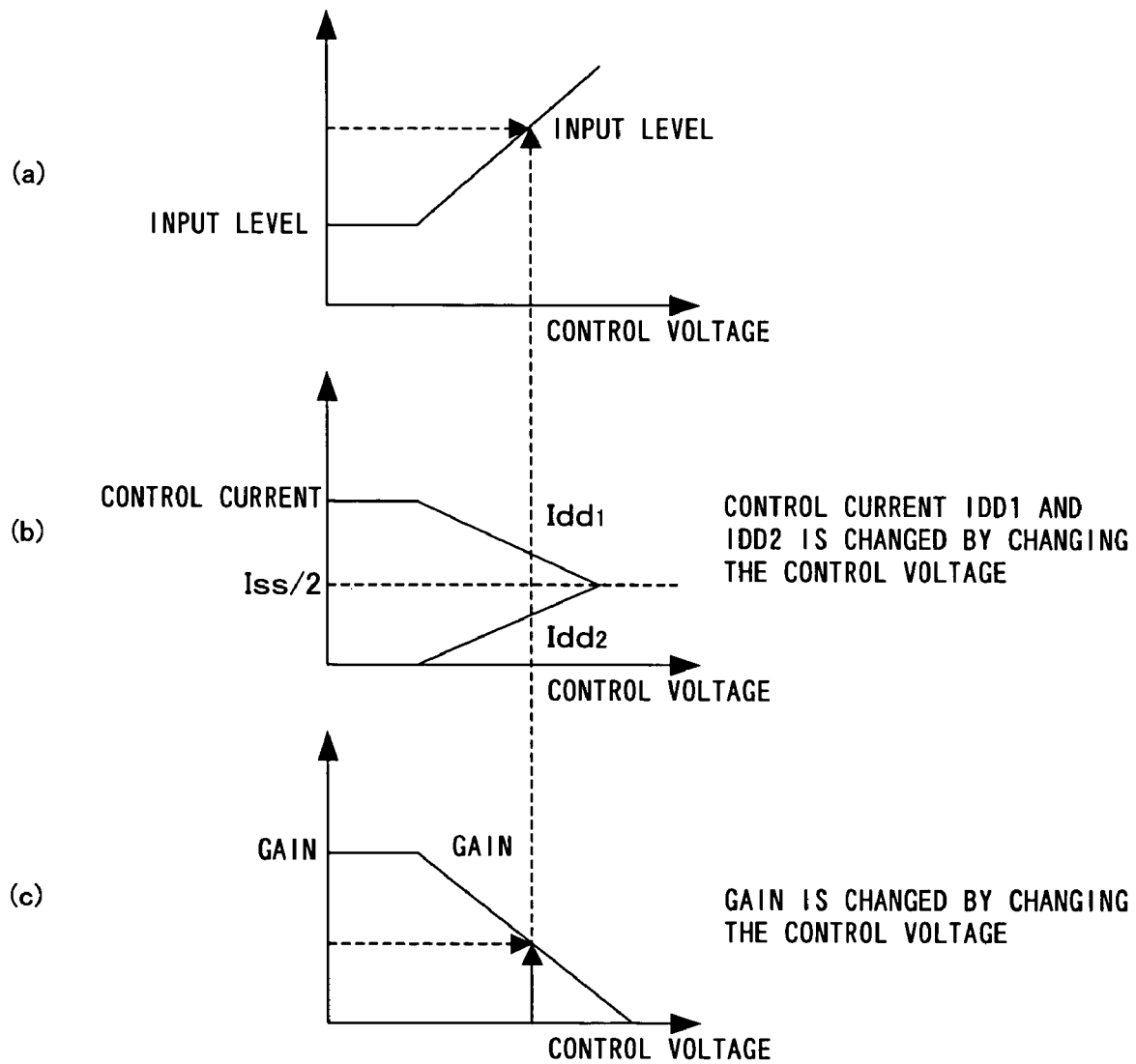
F I G. 5

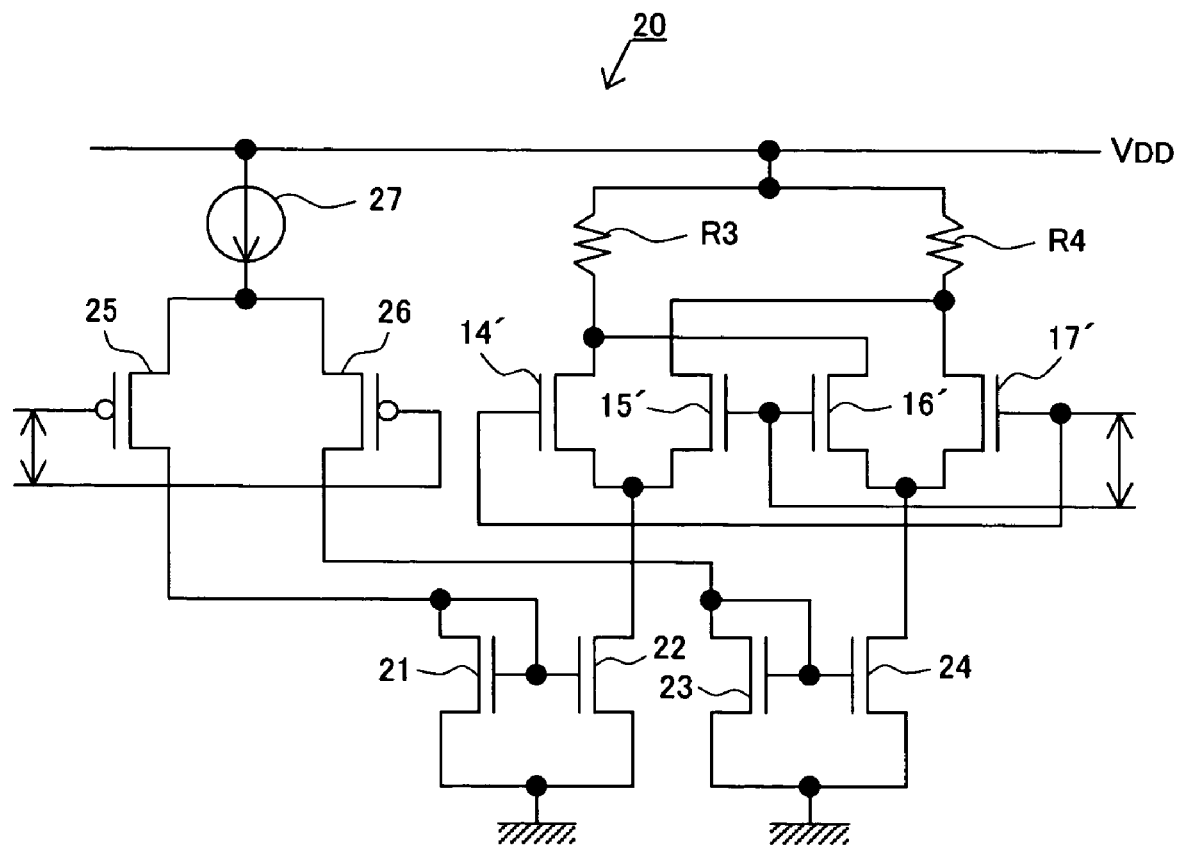
F I G. 6

AM INTERMEDIATE FREQUENCY VARIABLE GAIN AMPLIFIER CIRCUIT, VARIABLE GAIN AMPLIFIER CIRCUIT AND ITS SEMICONDUCTOR INTEGRATED CIRCUIT

FIELD OF THE INVENTION

The present invention relates to a variable gain amplifier circuit for amplifying an AM intermediate frequency signal, a variable gain amplifier circuit and a semiconductor integrated circuit mounting the variable gain amplifier circuit.

BACKGROUND OF THE INVENTION

A variable gain amplifier for controlling gain according to the change in level of an input signal is known in the art. As an example of the variable gain amplifier, patent reference 1 discloses a circuit in which a variable resistor means comprises a diode that is connected between the emitter terminals of a transistor constituting a differential amplifier that controls current flowing through this variable resistor means in such a way as to be proportional to the index of a control input.

Patent reference 2 discloses a circuit for controlling gain by changing the resistance value of a variable resistor that has as an input the two output currents of a differential amplifier circuit.

FIG. 4 shows an example of the variable gain amplifier circuit for controlling gain by changing current flowing through the MOS transistor of a differential amplifier circuit.

A variable gain amplifier circuit 10 comprises a current source 11, a p-channel MOS transistor 12 with a control voltage for controlling gain applied to the gate, a p-channel MOS transistor 13 with a control reference voltage applied to the gate, four p-channel MOS transistors 14-17 for differentially amplifying an input signal and its inverted signal, and resistors R1 and R2 which are connected to the drains of the p-channel MOS transistors 14 and 17 respectively and to ground.

The variable gain amplifier circuit 40 shown in FIG. 4 changes the gain of an amplifier circuit by controlling current flowing through the p-channel MOS transistor 12.

Next, the operation of the variable gain amplifier circuit 10 shown in FIG. 4 is described referring to FIG. 5(a)-5(c).

FIG. 5(b) shows the relationship between control current Idd1 and Idd2 flowing through the p-channel MOS transistors 12 and 13 of FIG. 4 respectively and a control voltage, in which the vertical axis indicates the control current level of Idd1 and Idd2, and the horizontal axis indicates the control voltage.

If the drain current (control current) Idd1 and Idd2 of the p-channel MOS transistors 12 and 13, respectively, become equal at a specific control voltage Va, as the control voltage decreases from this value, the drain current Idd1 and Idd2 of the p-channel MOS transistors 12 and 13 increases and decreases, respectively.

If an input signal level is low, a control voltage for increasing Idd1 is applied from a circuit, not shown in FIG. 4, to the gate of the p-channel MOS transistor 12. If Idd1 increases, the drain current Id1 of the p-channel MOS transistor 14 increases, and Idd2 supplied with current by the same current source 11 decreases resulting in a reduced the drain current Id4 of the p-channel MOS transistor 17.

Since currents flow proportional to drain current Id1, Id2 and the signal level through the resistors R1 and R2 respectively, the difference in output voltage between the resistors R1 and R2 increases to increase the gain of the variable gain amplifier circuit 10.

In FIG. 5(c), the vertical and horizontal axes indicate the gain of the variable gain amplifier circuit shown in FIG. 4 and a control voltage, respectively. The gain is controlled such that a decrease in the control voltage increases the gain if the input signal level lowers.

In FIG. 5(a), the vertical and horizontal axes indicate the level of an input signal and a control voltage, respectively. It is controlled so that the control voltage may increase if the input signal level increase and decrease if the input signal level decreases.

When it is considered that the current source 11 of the variable gain amplifier circuit 10 shown in FIG. 4 comprises a plurality of MOS transistors, at least three MOS transistors constituting the current source 11, the gain control MOS transistors 12 or 13, and signal amplification MOS transistors 14, 15, 16 or 17, all of which are connected in series. In this case, a power supply voltage VDD is required, which is a voltage more than three times the needed operation voltage for a MOS transistor. Therefore, the variable gain amplifier circuit 10 shown in FIG. 4 is not capable of being operated by a low power supply voltage.

In order to solve such a problem, for example, a variable gain amplifier circuit 20 shown in FIG. 6 can be considered. This variable gain amplifier circuit 20 can control gain by changing the current of a current mirror circuit. In FIG. 6, the same reference numerals are attached to the same components as those as in FIG. 4, and their descriptions are omitted.

The variable gain amplifier circuit 20 shown in FIG. 6 can be obtained by using a current mirror circuit comprising n-channel MOS transistors 21, 22, 23 and 24, p-channel MOS transistors 25 and 26 and n-channel MOS transistors 14'-17', instead of the p-channel MOS transistors 12 and 13 for controlling gain and p-channel MOS transistors 14-17.

The operation of n-channel MOS transistors 14'-17' is basically the same of the p-channel MOS transistors 14-17 shown in FIG. 4.

In the variable gain amplifier circuit 20, if a control voltage applied to the gate of a p-channel MOS transistor 25, for example, the drain current of the p-channel MOS transistors 25 and 26 increases and decreases, respectively. Respective currents proportional to the drain currents of the p-channel MOS transistors 25 and 26 flow through the drains of the n-channel MOS transistors 21 and 22, and the drains of the n-channel MOS transistors 23 and 24, respectively.

Therefore, by controlling the drain current of the p-channel MOS transistor 25, the voltage difference between the drain voltages of the n-channel MOS transistors 14' and 16', and 15' and 17' can be changed, thereby controlling the gain of the variable gain amplifier circuit 20.

Patent reference 1: Japanese Patent Application Publication No. H05-29856 (FIG. 1)

Patent reference 2: Japanese Patent Application Publication No. H07-122950 (FIG. 1)

SUMMARY of THE INVENTION

However, since the variable gain amplifier circuit 20 shown in FIG. 6 uses a larger number of MOS transistors than the variable gain amplifier circuit 10 shown in FIG. 4, noise generated inside the circuit increases. More particularly, in a variable gain amplifier circuit for amplifying an AM intermediate frequency signal, it is necessary to reduce noise in a low band.

It is an object of the present invention to provide a variable gain amplifier circuit operable with a lower power supply voltage and with less noise generated inside the circuit. It is another object of the present invention to be able to operate the gain control field-effect transistor of a variable gain amplifier circuit in a non-saturated region.

The AM intermediate frequency variable gain amplifier circuit of the present invention comprises first and second field-effect transistors for differentially amplifying an input signal and an inverted input signal obtained by inverting the input signal, a third field-effect transistor connected between the source of the first field-effect transistor and the source of the second field-effect transistor and to the gate of which a control voltage for controlling the differential amplification gain of the first and second field-effect transistors, and a bias circuit for applying a DC bias voltage for operating the third field-effect transistor in a non-saturated region.

According to the present invention, an AM intermediate frequency gain amplifier circuit and MOS integrated circuit, which are operable with a low power supply voltage and with less low-band noise generated in the circuit can be realized.

In the above-described invention, the bias circuit comprises at least a fourth field-effect transistor, the source of which is connected to the power supply and the gate of which is connected to the drain.

By adopting such a configuration, for example, even when the power supply voltage changes, the output voltage of the bias circuit can be maintained almost constant at the drain-to-source voltage of a field-effect transistor. Therefore, the fluctuation of a bias voltage can be suppressed. Since the third field-effect transistor can always be operated in a non-saturated region, the distortion of the output signal of the variable gain amplifier circuit can be reduced. Furthermore, since the third field-effect transistor of the bias circuit can comprise transistors with the same characteristic as the gain control third field-effect transistor, the influence on the change of the bias point due to a temperature change, a characteristic of unevenness among field-effect transistors and the like, can be reduced.

For example, the first and second field-effect transistors correspond to the p-channel MOS transistors 33 and 34 shown in FIG. 3, the third field-effect transistor corresponds to the p-channel MOS transistor 35 and the fourth field-effect transistor corresponds to the p-channel MOS transistor 46.

In the above-described invention, the bias circuit comprises at least the fourth field-effect transistor with the source connected to the power supply and the gate connected to the drain, and the fifth field-effect transistor, connected to the fourth field-effect transistor in series, with the gate connected to the drain.

By adopting such a configuration, for example, when current is supplied from a constant current circuit comprising field-effect transistors to the first and second field-effect transistors, the bias circuit can comprise the field-effect transistor with the same characteristic as the field-effect transistor of the constant current circuit and the first and second field-effect transistors. Therefore, the influence on the change of the bias point due to a temperature change, a characteristic unevenness among field-effect transistors and the like, can be reduced.

For example, the fourth and fifth field-effect transistors correspond to the p-channel MOS transistors 46 and 47 shown in FIG. 3.

In the above-described invention, a resistor is connected in parallel with the third field-effect transistor.

The variable gain amplifier circuit of the present invention comprises a first and second field-effect transistors for differentially amplifying an input signal and an inverted input signal obtained by inverting the input signal, a third field-effect transistor which is connected between the respective sources of the first and second field-effect transistors and to the gate of which a control voltage for controlling the differential amplification gain of the first and second field-effect transistors is applied, and a bias circuit comprising the fourth field-effect transistor at least whose source and gate are connected to the power supply and the drain, respectively, and which supplies a DC bias voltage for operating the third field-effect transistor in a non-saturated region.

According to the present invention, a variable gain amplification circuit operable with a low power supply voltage and with less noise generated inside the circuit can be realized.

Even when the power supply voltage changes, the output voltage of the bias circuit can be maintained almost constant at the drain-to-source voltage of a field-effect transistor. Therefore, the fluctuation of the bias voltage can be suppressed. Thus, the third field-effect transistor can be always operated in a non-saturated region, thereby reducing the distortion of the output signal of the variable gain amplifier circuit.

Furthermore, by constituting the fourth field-effect transistor of the bias circuit as a transistor with almost the same characteristic as the gain control third field-effect transistor, the influence on the change of the bias point due to a temperature change, a characteristic unevenness among field-effect transistors and the like, can be reduced.

According to the present invention, an AM intermediate frequency variable gain amplifier circuit operable with a low power supply voltage and with less noise generated inside the circuit can be realized. A variable gain amplifier circuit operable with a low power supply voltage, with less noise generated inside the circuit and with the less change of the bias point can be realized. By reducing the change of the bias point, the distortion of a signal in the variable gain amplifier circuit can be reduced.

BRIEF DESCRIPTION OF THE DRAWINGS

FIG. 1 is a circuit diagram of an AM intermediate frequency variable gain amplifier circuit in a first preferred embodiment;

FIG. 2 shows the characteristic of the drain current of a p-channel MOS transistor;

FIG. 4 is a circuit diagram of a conventional variable gain amplifier circuit;

FIG. 5 depicts an input level, control current and gain for a variable gain amplifier circuit;

FIG. 6 is another circuit diagram of a conventional variable gain amplifier circuit.

DETAILED DESCRIPTION OF THE PREFERRED EMBODIMENTS

Figure 3:
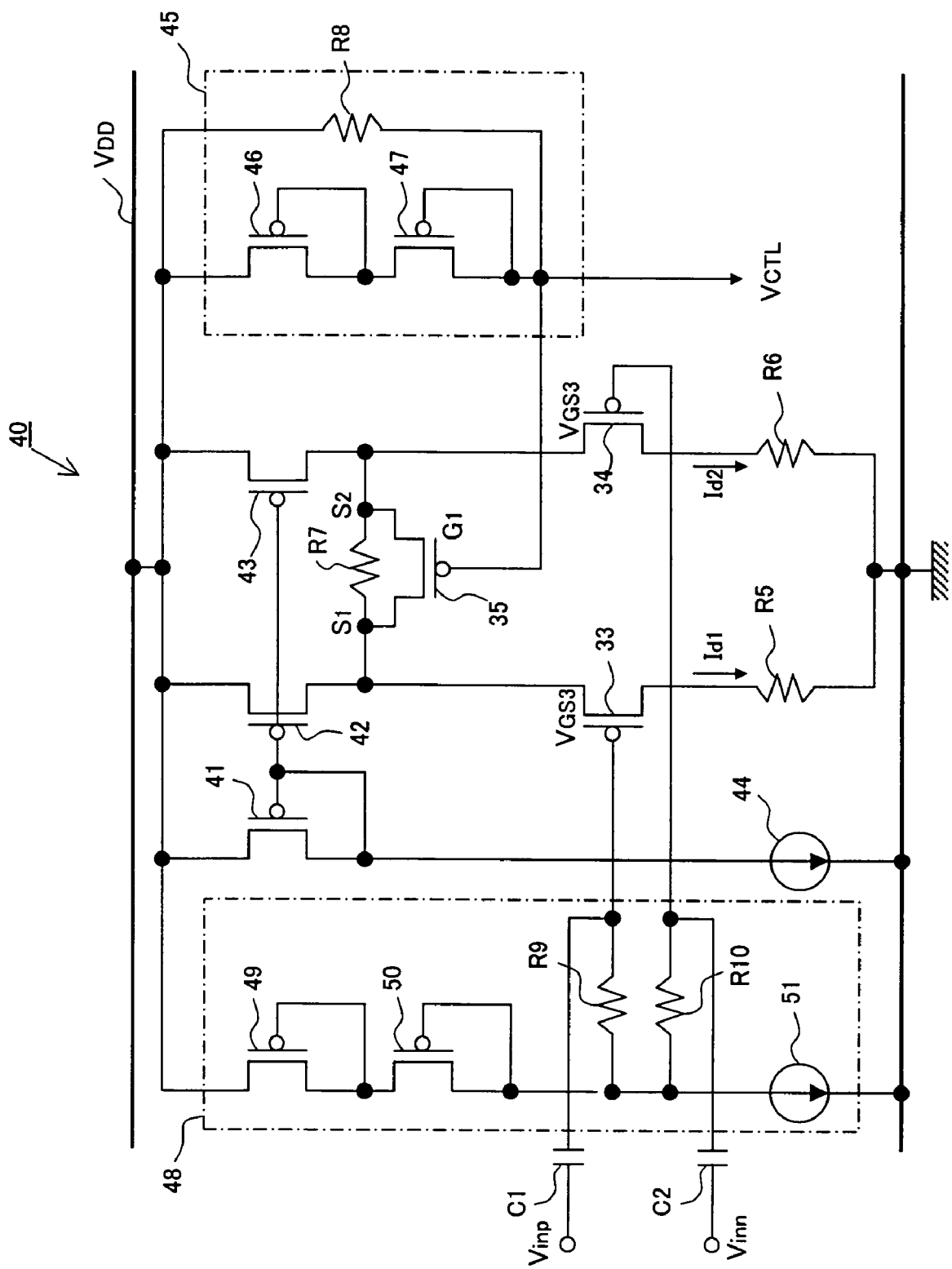
FIG. 3 is a circuit diagram of a variable gain amplifier circuit in a second preferred embodiment.

The preferred embodiments of the present invention are described below with reference to the drawings. FIG. 1 is a circuit diagram of an AM intermediate frequency variable gain amplifier circuit 30 in a first preferred embodiment of the present invention. The variable gain amplifier circuit described below is formed on a semiconductor circuit board by A CMOS process for manufacturing p-channel and n-channel MOS transistors.

In FIG. 1, one terminal of current sources 31 and 32 is connected to a power supply VDD and the other terminal is connected to the sources of p-channel MOS transistors (field-effect transistors) 33 and 34, respectively. Each of the current sources 31 and 32 comprises, for example, a current mirror circuit.

The p-channel MOS transistors 33 and 34 constitute a differential amplifier circuit, and the AM intermediate frequency signals Vinp and Vinn, whose phases differ by 180 degrees, are input to their respective gates. For the resistors R5 and R6, one terminal is connected to the respective drains of the p-channel MOS transistors 33 and 34 and the other terminal is grounded. The difference between the drain voltages Vout1 and Vout2 of the p-channel MOS transistors 33 and 34, respectively, becomes the output voltage of the AM intermediate frequency variable gain amplifier circuit 30.

A resistor R7 and a p-channel MOS transistor 35 are connected in parallel between the respective sources of the p-channel MOS transistors 33 and 34. A control voltage VCTL for controlling gain is input into the gate of the p-channel MOS transistor 35.

A circuit for outputting the control voltage VCTL, which is not shown in FIG. 1, detects the output voltage of the AM intermediate frequency variable gain amplifier circuit 30. If the output voltage increases, the circuit outputs the control voltage in such a way as to decrease gain, while if the output voltage decreases the circuit outputs the control voltage in such a way as to increase the gain.

Next, the operation of the AM intermediate frequency variable gain amplifier circuit 30 with the configuration above will be described.

The AM intermediate frequency variable gain amplifier circuit 30 in this first preferred embodiment operates the p-channel MOS transistor 35 in a non-saturated region to control current flowing through the p-channel MOS transistor 35 by changing its gate voltage VG.

FIG. 2 shows the relationship between the drain current ID and drain-to-source voltage VDS of a p-channel MOS transistor obtained when changing the drain-to-source voltage VDS.

The vertical and horizontal axes in FIG. 2 indicate the drain current ID and the drain-to-source voltage VDS, respectively. The resistance between the drain and source of a MOS transistor in a non-saturated region can indicate VDS/ID. Therefore, by changing the gate voltage VSG, the resistance value between the drain and source of the p-channel MOS transistor 35 can be changed to control the drain current ID.

If the amplitude of an input signal Vinp increases to increase the output voltage (Vout1-Vout2) of the AM intermediate frequency variable gain amplifier circuit 30 when the gain of the AM intermediate frequency variable gain amplifier circuit 30 is controlled at a specific value, a control voltage VCTL for increasing the gate-to-source voltage VGS in the forward bias direction is applied to the gate of the p-channel MOS transistor 35.

When the gate voltage VG of the p-channel MOS transistor 35 increases in the forward bias direction, the resistance value between the drain and source decreases. In this case, if a source voltage VS1 that includes a signal voltage obtained amplifying the input signal Vinp by the p-channel MOS transistor 33 that is larger than a source voltage VS2 that includes the signal voltage of the p-channel MOS transistor 34, current flowing into the p-channel MOS transistor 34 from the current source 31 via the p-channel MOS transistor 35 increases.

Since constant current 1s is supplied to the p-channel MOS transistors 33, 34 and 35 from the current sources 31 and 32, if current flowing into the p-channel MOS transistor 35 increases then the drain current Id1 of the p-channel MOS transistor 33 decreases by the same amount. Then, the drain current Id2 of the p-channel MOS transistor 34 increases by the increased amount of current of the p-channel MOS transistor 35.

As a result, the drain voltage Vout1 of one p-channel MOS transistor 33 of the differential amplifier circuit decreases and the drain voltage Vout2 of the other p-channel MOS transistor 34 increases. Thus, the difference between the drain voltage Vout1 of the p-channel MOS transistor 33 and the drain voltage Vout2 of the p-channel MOS transistor 34 decreases to reduce the gain of the AM intermediate frequency variable gain amplifier circuit 30.

If the amplitude of the input signal Vinp decreases to reduce the output voltage of the AM intermediate frequency variable gain amplifier circuit 30, a control voltage VCTL for reducing the gate voltage of a p-channel MOS transistor is applied. If the gate voltage VG decreases, the resistance value between the drain and source increases to reduce current flowing into the p-channel MOS transistor 34 from the current source 31 via the p-channel MOS transistor 35.

If current flowing into the p-channel MOS transistor 35 decreases, the drain current Id1 of the p-channel MOS transistor 33 decreases by the reduced amount to also reduce the drain current Id2 of the p-channel MOS transistor 34.

As a result, the drain voltage Vout1 of one p-channel MOS transistor 33 of the differential amplifier circuit increases and the drain voltage Vout2 of the other p-channel MOS transistor 34 decreases. Thus, the difference between the drain voltage Vout1 and the drain voltage Vout2 increases to increase the gain of the AM intermediate frequency variable gain amplifier circuit 30.

According to the above-described first preferred embodiment, the gain of the AM intermediate frequency variable gain amplifier circuit 30 can be changed by operating the p-channel MOS transistor 35 in a non-saturated area and controlling its gate voltage VG.

According to the AM intermediate frequency variable gain amplifier circuit 30 in this first embodiment, the number of stages of MOS transistors connected between the power supply and the earth can be reduced. Therefore, a low power supply voltage can be used and also the number of transistors can be reduced, thereby reducing low-band noise generated inside the circuit.

FIG. 3 is a circuit diagram of the variable gain amplifier circuit 40 in the second preferred embodiment of the present invention. In the following description, the same reference numerals are attached to the same components as the circuit shown in FIG. 1 and their descriptions are omitted.

In the AM intermediate frequency variable gain amplifier circuit 30 shown in FIG. 1, if, for example, the power supply voltage increases when a voltage obtained by dividing the power supply voltage VDD by a resistor is supplied, there is a possibility that the bias voltage may increase to enter the maximum value of the drain-to-source voltage VDS of the p-channel MOS transistor 35 into a non-saturated region. If the maximum value of the drain-to-source voltage VDS of the p-channel MOS transistor 35 enters a non-saturated region, the distortion of a signal increases. It is the object of the second preferred embodiment to reduce the distortion of a signal, generated by the fluctuation of the power supply voltage of the bias circuit.

Shown in FIG. 3 are p-channel MOS transistors 41, 42 and 43 and a current source 44 form a current mirror circuit, which corresponds to the current sources 31 and 32 shown in FIG. 1.

The current source 44 is connected to the drain of the p-channel MOS transistor 41, and the other terminal of the current source 44 is grounded. The respective drain currents of the p-channel MOS transistors 42 and 43 are proportional to the drain current of the p-channel MOS transistor 41. The drain current of the p-channel MOS transistor 41 is equal to the output current of the current source 44.

The bias circuit 45 of the p-channel MOS transistor 35 comprises two p-channel MOS transistors 46 and 47 whose drain and gate are connected to each other and a resistor R8 is connected in parallel to the p-channel MOS transistors 46 and 47.

The source of the p-channel MOS transistor 46 and one terminal of the resistor R8 are connected to the power voltage VDD, and the drain of the p-channel MOS transistor 46 is connected to the source of the p-channel MOS transistor 47. The drain of the p-channel MOS transistor 47 and the other terminal of the resistor R8 are connected to the gate G1 of the p-channel MOS transistor 35.

The bias circuit of the p-channel MOS transistors 33 and 34 of the differential amplifier circuit comprises two p-channel MOS transistors 49 and 50 whose drain and gate are connected in series with each other, a current source 51 and resistors R9 and R10.

The source and drain of the p-channel MOS transistor 49 is connected to the power voltage VDD and the source of the p-channel MOS transistor 50, respectively. The drain of the p-channel MOS transistor 50 is connected to the resistors R9 and R10 and the current source 51. The other terminals of the resistors R9 and R10 are connected to the gates of the p-channel MOS transistors 33 and 34, respectively. The other terminal of the current source 51 is grounded. The input signal Vinp and its inverted signal Vinn are input into the gates of the p-channel MOS transistors 33 and 34 via capacitors C1 and C2, respectively.

Next, the operation of the variable gain amplifier circuit 40 with such a configuration is described. Since the operation of controlling gain by changing the resistance value of the p-channel MOS transistor 35 against the change in amplitude of the input signal Vinp and Vinn is the same as the circuit shown in FIG. 1, therefore the operations of the bias circuits 45 and 48 are mainly described.

Since the gate and drain of the p-channel MOS transistors 46 and 47 of the bias circuit 45 are short-circuited to each other, a voltage approximately twice the drain-to-source voltage of a p-channel MOS transistor is applied to the gate of the p-channel MOS transistor 35, based on the power supply voltage VDD.

Thus, even when the power supply voltage VDD changes, the gate voltage VG of a p-channel MOS transistor becomes an almost constant voltage determined by the drain-to-source voltage of the p-channel MOS transistors 46 and 47.

Since the gate voltage VG of the p-channel MOS transistor 35 can be prevented from changing due to the fluctuation of the power supply voltage VDD, the maximum value of the difference between voltages obtained by amplifying the input signals Vinp and Vinn (the voltage VDS between S1 and S2 of the p-channel MOS transistor 35) can be prevented from entering a non-saturated region. Thus, the distortion of the output signal of the differential amplifier circuit can be reduced.

Furthermore, since the p-channel MOS transistors 46 and 47 for supplying a bias voltage comprise transistors with the same characteristic as the gain control p-channel MOS transistor 35 and the p-channel MOS transistors 42 and 43 of the current mirror circuit, the characteristic of unevenness among the transistors and their temperature characteristics can be made uniform. Thus, the influence on the change of the bias point due to the characteristic unevenness and the temperature change can be reduced.

The bias circuits 48 of the p-channel MOS transistors 33 and 34 also comprise transistors with the same characteristic as the p-channel MOS transistors 33 and 34 for supplying the bias voltage, like the above-described bias circuit 45.

Thus, since an almost constant voltage determined by the drain-to-source voltage of a p-channel MOS transistor is applied to the p-channel MOS transistors 33 and 34, the fluctuation of the bias voltage can be reduced.

Furthermore, because the p-channel MOS transistors 49 and 50 for supplying the bias voltage comprise transistors with the same characteristic as the p-channel MOS transistors 33 and 34 of the differential amplifier circuit and the p-channel MOS transistors 42 and 43 of the current mirror circuit, the characteristic unevenness among transistors and their temperature characteristics can be made uniform. Thus, the influence on the change of the bias point due to the characteristic unevenness and temperature change can be suppressed.

The present invention is not limited to the above-described preferred embodiments and it can also be configured as follows.

Although in the above description, the entire variable gain amplifier circuit comprises p-channel MOS transistors, only n-channel MOS transistors or both p-channel and n-channel MOS transistors can also be used.

The configuration of the bias circuit 45 is not limited to two p-channel MOS transistors 46 and 47 and the resistor R8, it can also comprise one MOS transistor. Alternatively, two or more MOS transistors can be used according to the configuration of a circuit for supplying the bias voltage. Alternatively, a PN junction can also be used instead of a MOS transistor.

The present invention is not limited to the AM intermediate frequency variable gain amplifier circuit of a radio set and is can also be applied to the variable gain amplifier circuit of various circuits.

The invention claim is:

1. An AM intermediate frequency variable gain amplifier circuit, comprising:
   first and second field-effect transistors for differentially amplifying an input signal and an inverted input signal obtained by inverting the input signal;
   a third field-effect transistor that is connected between a source of the first field-effect transistor and a source of the second field-effect transistor and to a gate of which a control voltage for controlling differential amplification gain of the first and second field-effect transistors is applied; and
   a bias circuit for applying a DC bias voltage for operating the third field-effect transistor in a non-saturated region, wherein the bias circuit comprises at least a fourth field-effect transistor comprising a source connected to a power supply and a gate and drain connected together.

2. An AM intermediate frequency variable gain amplifier circuit, comprising:
   first and second field-effect transistors for differentially amplifying an input signal and an inverted input signal obtained by inverting the input signal;
   a third field-effect transistor that is connected between a source of the first field-effect transistor and a source of the second field-effect transistor and to a gate of which a control voltage for controlling differential amplification gain of the first and second field-effect transistors is applied; and
   a bias circuit for applying a DC bias voltage for operating the third field-effect transistor in a non-saturated region, wherein the bias circuit comprises at least a fourth field-effect transistor comprising a source connected to a power source and a gate and drain connected together, and a fifth field-effect transistor that is connected to the fourth field-effect transistor in series comprising a gate and drain connected together.

3. A variable gain amplifier circuit, comprising:

first and second field-effect transistors for differentially amplifying an input signal and an inverted input signal obtained by inverting the input signal;

a third field-effect transistor which is connected between a source of the first field-effect transistors and a source of the second field-effect transistor and to a gate of which a control voltage for controlling differential amplification gain of the first and second field-effect transistors is applied; and a bias circuit comprising at least a fourth field-effect transistor comprising a source connected to a power supply and a gate and drain connected together, and which supplies a DC bias voltage for operating the third field-effect transistor in a non-saturated region.

4. The variable gain amplifier circuit according to claim 3, wherein the bias circuit comprises a fifth field-effect transistor that is connected to the fourth field-effect transistor in series comprising a gate and drain connected together.

5. The variable gain amplifier circuit according to claim 3, comprising a constant current circuit for supplying constant current to the sources of the first and second MOS transistors.

6. A variable gain amplifier circuit, comprising:

first and second field-effect transistors for differentially amplifying an input signal and a signal obtained by inverting the input signal;

a third field-effect transistor that is connected between a source of the first field-effect transistor and a source of the second field-effect transistor and a control voltage for controlling differential amplification gain of the first and second field-effect transistors is applied to a gate of the third field-effect transistor;

a first bias circuit which comprises at least a fourth field-effect transistor comprising a source connected to a power supply and a gate and drain connected together and supplies a DC bias voltage for operating the third field-effect transistor in a non-saturated region; and a second bias circuit which comprises a fifth field-effect transistor comprising source connected to a power supply and a gate and drain connected together and supplies the first and second field-effect transistors with a DC bias voltage.

7. A semiconductor integrated circuit on the semiconductor circuit board of which is formed a variable gain amplifier circuit by a CMOS process, comprising:

first and second MOS transistors for differentially amplifying an input signal and a signal obtained by inverting the input signal;

a third MOS transistor that is connected between a source of the first MOS transistor and a source of the second MOS transistor and a control voltage for controlling differential amplification gain of the first and second MOS transistors is applied to a gate of the third MOS transistor; and a bias circuit which comprises a fourth MOS transistor comprising a source connected to a power supply and a gate and drain is connected together and supplies a DC bias voltage for operating the third MOS transistor in a non-saturated region.

8. A semiconductor integrated circuit on the semiconductor circuit board of which is formed a variable gain amplifier circuit, comprising:

a current source;

first and second MOS transistors each comprising a source connected to output of the current source;

a third MOS transistor that is connected between the source of the first MOS transistor and the source of the second MOS transistor and to a gate of which a control voltage is applied for controlling respective differential amplification gain of the first and second MOS transistors; and a bias circuit which comprises a fourth MOS transistor comprising a source is connected to a power supply and a gate and drain are connected together and a fifth MOS transistor that is connected to the fourth MOS transistor in series and comprises a gate connected to a drain, and supplies a DC bias voltage for operating the third MOS transistor in a non-saturated region.

* * * * *

UNITED STATES PATENT AND TRADEMARK OFFICE
CERTIFICATE OF CORRECTION

PATENT NO.      : 7,443,240 B2
APPLICATION NO. : 10/580167
DATED           : October 28, 2008
INVENTOR(S)     : Hiroshi Katsunaga et al.

It is certified that error appears in the above-identified patent and that said Letters Patent is hereby corrected as shown below:

On Title Page 1, Item (73), please delete "Kabushiki Kaisha Toyota Jidoshokki, Kariya-Shi (JP); Niigata Seimitsu Co., Ltd., Joetsu-Shi (JP)" and insert therefore -- Niigata Seimitsu Co., Ltd., Joetsu-Shi (JP) --;

Column 1, line 45, please delete "referring to FIG. 5(a)-5(c)." and insert therefore -- referring to FIGS. 5(a)-5(c). --;

Column 1, lines 63-64, please delete "resulting in a reduced the drain current Id4" and insert therefore -- resulting in a reduced drain current Id4 --;

Column 2, lines 11-12, please delete "if the input signal level increase" and insert therefore -- if the input signal level increases --;

Column 2, lines 14-15, please delete "When it is considered that the current source 11 of the variable gain amplifier circuit 10" and insert therefore -- The current source 11 of the variable gain amplifier circuit 10 --;

Column 2, lines 40-41, please delete "if a control voltage applied to the gate of a p-channel MOS transistor 25," and insert therefore -- if a control voltage is applied to the gate of a p-channel MOS transistor 25, --;

Column 3, lines 14-15, please delete "for controlling the differential amplification gain of the first and second field-effect transistors, and a bias" and insert therefore -- for controlling the differential amplification gain of the first and second field-effect transistors is applied, and a bias --;

Column 4, line 51, please delete "variable gain amplifier circuit;" and insert therefore -- variable gain amplifier circuit; and --;

Column 5, line 63, please delete "Since constant current 1s is supplied" and insert therefore -- Since constant current Is is supplied --;

Column 6, line 62, please delete "a current source 44 form a current mirror circuit," and insert therefore -- a current source 44 forming a current mirror circuit, --;

Column 8, lines 27-28, please delete "and the resistor R8, it can also comprise one MOS transistor." and insert therefore -- and the resistor R8, but can also comprise one MOS transistor. --; and

UNITED STATES PATENT AND TRADEMARK OFFICE
CERTIFICATE OF CORRECTION

PATENT NO.         : 7,443,240 B2
APPLICATION NO. : 10/580167
DATED                 : October 28, 2008
INVENTOR(S)      : Hiroshi Katsunaga et al.

It is certified that error appears in the above-identified patent and that said Letters Patent is hereby corrected as shown below:

Column 8, lines 33-35, please delete "radio set and is can also be applied to the variable gain amplifier circuit of various circuits." and insert therefore -- radio set, but can also be applied to the variable gain amplifier circuit of various circuits. --.

In Claim 3, column 9, lines 9-10, please delete "between a source of the first field-effect transistors" and insert therefore -- between a source of the first field-effect transistor --; and In Claim 6, column 10, lines 1-3, please delete "a fifth field-effect transistor comprising source connected to a power supply" and insert therefore -- a fifth field-effect transistor comprising a source connected to a power supply --.

Signed and Sealed this

Twenty-fifth Day of August, 2009

David J. Kappos
*Director of the United States Patent and Trademark Office*